United States Patent
Kunze et al.

(10) Patent No.: US 10,930,018 B2
(45) Date of Patent: Feb. 23, 2021

(54) QUANTIZER DETERMINATION, COMPUTER-READABLE MEDIUM AND APPARATUS THAT IMPLEMENTS AT LEAST TWO QUANTIZERS

(71) Applicant: Basler AG, Ahrensburg (DE)

(72) Inventors: Jörg Kunze, Ahrensburg (DE); Michael Niesyto, Ahrensburg (DE)

(73) Assignee: BASLER AG, Ahrensburg (DE)

( * ) Notice: Subject to any disclaimer, the term of this patent is extended or adjusted under 35 U.S.C. 154(b) by 43 days.

(21) Appl. No.: 16/392,985

(22) Filed: Apr. 24, 2019

(65) Prior Publication Data

US 2019/0333250 A1     Oct. 31, 2019

(30) Foreign Application Priority Data

Apr. 30, 2018  (DE) .................... 10 2018 110 384.0
May 22, 2018  (DE) .................... 10 2018 112 215.2

(51) Int. Cl.
| | | |
|---|---|---|
| H04N 19/124 | (2014.01) | |
| G06T 9/00 | (2006.01) | |
| G06T 7/00 | (2017.01) | |
| G06F 17/18 | (2006.01) | |
| G06T 3/40 | (2006.01) | |

(52) U.S. Cl.
CPC ................ *G06T 9/00* (2013.01); *G06F 17/18* (2013.01); *G06T 3/40* (2013.01); *G06T 7/97* (2017.01); *G06T 2207/20016* (2013.01)

(58) Field of Classification Search
CPC combination set(s) only.
See application file for complete search history.

(56) References Cited

U.S. PATENT DOCUMENTS

| | | | | |
|---|---|---|---|---|
| 4,736,387 A | | 4/1988 | Tzou | |
| 5,363,210 A | * | 11/1994 | Sasaki | ................ H04N 1/40087 358/3.15 |
| 5,764,803 A | * | 6/1998 | Jacquin | ................ H04N 19/503 375/E7.081 |
| 6,246,345 B1 | * | 6/2001 | Davidson | ............ G10L 19/0208 341/51 |

(Continued)

FOREIGN PATENT DOCUMENTS

EP     2501133 A2     9/2012

OTHER PUBLICATIONS

Joachim Keinert, et al., "Introduction to JPEGXS—The New Low Complexity Codec Standard for Professional Video Production," https://www.ibc.org/content-management/introduction-to-jpeg-xs/2452.article.

(Continued)

*Primary Examiner* — Cindy Trandai
(74) *Attorney, Agent, or Firm* — Greer, Burns & Crain, Ltd.

(57) ABSTRACT

A method for determining a second quantizer for quantizing digital images, wherein the second quantizer is determined for a specified number of levels, which is at least two. For the determination, a first quantizer with a lower number of levels than the specified one is taken into consideration. Furthermore, a method for coding an image comprising a plurality of pixels, a computer-readable medium, an apparatus, which implements at least two quantizers as a digital circuit and a digital camera with such an apparatus is disclosed.

13 Claims, 2 Drawing Sheets

(56) References Cited

U.S. PATENT DOCUMENTS

| | | | | |
|---|---|---|---|---|
| 6,664,913 B1* | 12/2003 | Craven | ............... | H03M 7/3046 |
| | | | | 341/138 |
| 6,864,818 B1* | 3/2005 | Hezar | ................... | H03M 3/396 |
| | | | | 341/143 |
| 7,574,355 B2* | 8/2009 | Grill | ..................... | G10L 19/032 |
| | | | | 704/230 |
| 7,801,383 B2 | 9/2010 | Sullivan | | |
| 9,281,007 B2* | 3/2016 | Wu | ..................... | G11B 20/1403 |
| 2002/0106104 A1* | 8/2002 | Brunk | ..................... | G10L 21/00 |
| | | | | 382/100 |
| 2003/0048360 A1* | 3/2003 | Herley | ................. | H04N 1/2112 |
| | | | | 348/222.1 |
| 2003/0128756 A1* | 7/2003 | Oktem | .................. | H04N 19/17 |
| | | | | 375/240.03 |
| 2006/0067436 A1* | 3/2006 | Potkonjak | ......... | H03M 13/3961 |
| | | | | 375/341 |
| 2006/0293884 A1* | 12/2006 | Grill | ..................... | G10L 19/032 |
| | | | | 704/219 |
| 2007/0147512 A1* | 6/2007 | Eckart | ................. | H04N 19/115 |
| | | | | 375/240.24 |
| 2007/0237222 A1* | 10/2007 | Xia | ..................... | H04N 19/126 |
| | | | | 375/240.03 |
| 2009/0161165 A1* | 6/2009 | Fujimoto | ............. | G06K 15/107 |
| | | | | 358/2.1 |
| 2011/0001776 A1* | 1/2011 | Suzuki | ................ | B41J 2/16526 |
| | | | | 347/14 |
| 2013/0051676 A1* | 2/2013 | Wehnes | .................... | G06T 5/10 |
| | | | | 382/190 |
| 2013/0290813 A1* | 10/2013 | Ramamoorthy | ..... | G11C 27/005 |
| | | | | 714/773 |
| 2013/0321871 A1* | 12/2013 | Uchidate | .................. | H04N 1/40 |
| | | | | 358/3.05 |
| 2014/0071143 A1* | 3/2014 | Wang | ........................ | G06T 1/60 |
| | | | | 345/531 |
| 2015/0187366 A1* | 7/2015 | Moriya | ............... | H03M 7/3059 |
| | | | | 704/206 |
| 2016/0057418 A1* | 2/2016 | Lei | ....................... | H04N 19/136 |
| | | | | 375/240.03 |
| 2016/0065962 A1* | 3/2016 | Lei | ....................... | H04N 19/107 |
| | | | | 375/240.03 |
| 2016/0232908 A1* | 8/2016 | Fuchs | ..................... | G10L 25/15 |
| 2017/0178649 A1* | 6/2017 | Sung | ..................... | G10L 19/038 |
| 2018/0250953 A1* | 9/2018 | Yoshida | ................. | G06F 3/1247 |
| 2018/0262759 A1* | 9/2018 | Fracastoro | ............. | H04N 19/14 |
| 2018/0367197 A1* | 12/2018 | Yang | .................... | H04B 7/0417 |
| 2019/0181878 A1* | 6/2019 | Rubio Fern Ndez | ... | H03M 3/40 |
| 2020/0160157 A1* | 5/2020 | Kim | ..................... | G11C 7/1051 |

OTHER PUBLICATIONS

Fritz Lebowsky, et al., "Extraordinary Perceptual Color Stability in Low Cost, Real Time Color Image Compression Inspired by Structure Tensor Analysis," Electronic Imaging 2017, No. 18, pp. 156-167.

* cited by examiner

QUANTIZER DETERMINATION, COMPUTER-READABLE MEDIUM AND APPARATUS THAT IMPLEMENTS AT LEAST TWO QUANTIZERS

CROSS-REFERENCES TO RELATED APPLICATIONS

This application claims the benefit of the German patent application No. 10 2018 110 384.0 filed on Apr. 30, 2018, and German patent application No. 10 2018 112 215.2 filed on May 22, 2018 the entire disclosures of which are incorporated herein by way of reference.

FIELD OF THE INVENTION

The present invention relates to a method for determining a quantizer for quantizing digital images, a method for coding an image consisting of a plurality of pixels, a computer-readable medium, an apparatus, which implements at least two quantizers as a digital circuit and a digital camera.

BACKGROUND OF THE INVENTION

For image capture, digital cameras are available with an optical system, as well as a multitude of image sensors, which are respectively set up to generate electrical charges from incidental light. The related signals are typically converted to bit-words (for example, 8-digit bytes) (or are assigned to these) and can, depending on the camera type or intended purpose, be saved in the camera and/or be transmitted (in a wireless or wired manner) to a receiver.

Since only a limited memory space and a limited transmission bandwidth are generally available, in some applications, the data are compressed with the aid of suitable algorithms and then later decompressed again.

In the publication EP 2 501 133 A2, a method and an apparatus for bandwidth reduction for image data are disclosed. Thereby, a difference between the value of a pixel and the value, which is determined from an adjacent or a temporally preceding pixel, is coded as a bit-word. The bit-word has a length, which corresponds to the rounded negative dual logarithm of a neighboring difference distribution function of the value of the difference to be coded.

The publication "Extraordinary perceptual color stability in low cost, real time color image compression inspired by structure tensor analysis" (in: Electronic Imaging 2017 (2017), no. 18, pp. 156-167.—ISSN 2470-1173) by Fritz Lebowsky and Mariano Bona discloses an algorithm for image compression where gradients two adjacent pixels are calculated for a pixel. Based on the gradients, a differentiation is made between three classes, namely, extremum, contour and level. Depending on the class, the gradients are quantized, taking an error density and a local brightness into account. From the quantized gradients, the one that produces the minimal error is transmitted.

From the publication published at https://www.ibc.org/content-management/introduction-to-jpeg-xs/2452.article "INTRODUCTION TO JPEG XS-THE NEW LOW COMPLEXITY CODEC STANDARD FOR PROFESSIONAL VIDEO PRODUCTION" by Joachim Keinert, Jean-Baptiste Lorent, Antonin Descampe, Gael Rouvroy, and Siegfried Fößel, a coding is known, which comprises an integer irreversible wavelet transformation and an entropy coding of the resulting wavelet coefficient. Thereby, image data should be transmitted with a low level of quality loss and short latency, thereby making higher resolutions possible, for example, in 360° films.

Other known image compression methods include JPEG, PNG, and GIF for example. However, in the case of JPEG, unfavorable losses arise so that the decompressed image relatively strongly deviates from the original image and only a low level of bandwidth reduction is frequently achieved using the PNG and the GIF method.

The respective algorithms for data compression can comprise a quantization, which can lead to an irreversible reduction in the data volume. The number of levels of a quantizer (and thereby, a number of values, which the quantizer can assume) thereby determines a resolution of the quantization.

In particular, quantizers can assign respective quantizer values to differences in pixel values of a digital image. The quantizer values can then be assigned to a bit sequence, for example, and be coded in this way, for example, by means of entropy coding.

The so-called "ideal" quantizer has a number of levels that is equal to the number of possible differences in an image. For example, it can be or implement the identity map and makes a loss-free saving and transmission possible.

In contrast, by using a quantizer with fewer levels, a higher degree of compression can be achieved. Depending on the respective image or image area however, undesired image artefacts may occur.

It is therefore favorable if a quantizer can be selected depending on the respective context.

In the publication U.S. Pat. No. 7,801,383 B2, multitudes of indexed quantizers are taken into consideration, the level classification of which is successively refined. From U.S. Pat. No. 4,736,387 A, a quantizing apparatus is known, which evaluates a real-valued signal with a selected restrictive value and generates a bit depending on the result.

SUMMARY OF THE INVENTION

An object of the present invention is to provide a technique that makes a favorable context-dependent quantizer selection possible. An object of the invention is to additionally make a favorable coding of an image consisting of a plurality of pixels possible.

A (first) method according to the invention is used to determine a quantizer, using which digital images and image areas can be quantized. The quantizer is determined for a specified number of levels, which is at least two. Thereby, for the determination, another quantizer with a lower number of levels than the specified one is taken into consideration. Preferably, the other quantizer comprises a non-linear or non-equidistant graduation of the quantizer levels (so that levels with varying widths occur between at least two quantizer levels). The quantizer determined or to be determined in accordance with the method according to the invention shall also be referred to as a "second" quantizer in the following and the "other" quantizer shall also be referred to as a "first" quantizer for the sake of better distinguishability.

By virtue of taking the other quantizer under consideration, it is possible for such a method to match the quantizer to be determined with the other quantizer. In this way, possible differences which result between the quantizer values when using the other quantizer, on the one hand, and the quantizer determined in such a manner, on the other hand, can be specifically influenced and synergies can be established. In particular, this makes a favorable control of a compression of the image data possible.

Thereby, initially, a preliminary version of the quantizer is determined with the specified number of levels; the preliminary version preferably comprises a non-linear graduation of the quantizer levels. Those values of the preliminary version, which are closest to a respective quantizer value of the other quantizer, are then replaced with these values of the other quantizer.

For every quantizer value w of the other quantizer, a value v of the preliminary version is determined, which lies closest to the quantizer value w from all values of the preliminary version. The quantizer to be determined is then set in such a way that it assigns the quantizer value w instead to points (in particular pixel differences), which were mapped for value v according to the preliminary version. At the mentioned points, the quantizer to be determined comprises quantizer values that are balanced with the other quantizers.

For the remaining points (or pixel differences), the quantizer to be determined can be specified in such a way that it assumes the same values at these points as the preliminary version. As an alternative, an assignment determined in this way can be viewed as an intermediate version, from which the quantizer (for example by means of applying the Lloyd-Max method) can be determined thereby subject to maintaining the balanced values. Thereby, level changes (discontinuities) at the same point of the definition range can occur like in the case of the preliminary version or on other points than in the case of the preliminary version. The value sets of the quantizer to be determined (or of the one determined), on the one hand, and the intermediate version, on the other hand, can coincide or differ by at least one quantizer value; in particular, the quantizer to be determined (or the one determined) can assume at least one quantizer value, which the intermediate version does not assume.

In particular, in the case of these embodiments, the value set of the other quantizer is embedded into the value set of the quantizer to be determined. This makes a particularly favorable control possible in the case of coding an image: If it is namely determined that one of the two quantizers results in an unfavorable quantizer value (for example, due to large artefacts or requiring too great a bandwidth for a transmission), the respective other quantizer can be selected and applied (to the same pixel difference as before or to a different pixel difference). The changes resulting from this can be estimated in advance due to balancing the quantizers.

The preliminary version can, for example, be determined by means of a Lloyd-Max method.

The method can additionally entail determining at least one third quantizer, which has a greater number of levels than the one specified for the second quantizer. Thereby, the second quantizer determined for the specified number of levels can be taken into consideration. In particular, the method (respectively in accordance with one of the embodiments disclosed in this publication) can be iterated and, thereby, a multitude of quantizers with an increasing number of levels can be determined. The multitude of quantizers, for example, can comprise three, at least four, at least eight or more quantizer determined in such a way.

Preferably, the method is executed in a computer unit; the specified number of levels can thereby be entered by a user or generated automatically.

In accordance with a favorable embodiment, the method additionally entails implementing the determined quantizer as an electronic circuit, e.g., as a digital or analogue circuit. Thereby, the determined quantizer is physically implemented as an apparatus.

A (second) method according to the invention is used for the coding of an image consisting of a plurality of pixels. For at least one pixel of the plurality, thereby, a differential value is calculated from the value of the pixel and at least one value of a neighboring pixel in the image or in an image sequence containing the image. A quantizer value is then assigned to the differential value by means of a quantizer, which was determined in accordance with one of the embodiments of a first inventive method disclosed in this publication. The method can additionally include the determination of the quantizer.

Thereby, a coding of the image results from the quantizer value (which can be furthermore assigned to a bit sequence), possibly plus values (in particular bit sequences) possibly plus values (in particular, bit sequences) which can be determined for other pixels of the plurality in a corresponding way or in another way.

In accordance with a favorable embodiment of the present invention, the taking under consideration entails assuming at least one or all of the first quantizer value(s) assumed by the other quantizer (the "first" quantizer) as quantizer value(s) of the ("second") quantizer to be determined.

The (second) quantizer determined in this way is adapted to the other (first) quantizer to the extent that it has at least one quantizer value of the other quantizer in common with this.

In accordance with a favorable embodiment, the preliminary version of the quantizer is based on at least one probability density function. Such a probability density function (also referred to as density function in short) preferably describes a probability distribution of pixel differences in one or a plurality of digital images: It has namely been shown that the incidences of pixel differences in the case of the captured images map the reality are distributed very similarly to one another.

In particular the known probability density function can be determined by means of density functions, which are assigned to at least a reference image, i.e., a digital image of a predetermined reference image set, such density functions are also called "reference density functions." Thereby, the probability density function can be referred to at points as an arithmetical or geometric means of the reference density functions (at the respective point of the definition range), wherein the average can be weighted or unweighted. The reference image set can contain one or a plurality of (digital) image(s) of a predetermined library (in particular, coincide with such a library) and/or at least one digital image, which is, for example, created or has been created at the time of application; for example, the digital reference image can be an image preceding or having preceded the image to be coded or it can even be the image to be coded itself.

At least one of the reference density functions (or even all average reference density functions) can then approximate a relative frequency of occurrence of the pixel differences, which occur in the respective related reference image as pixel value differences of adjacent pixels.

Additionally or as an alternative, at least one of the reference density functions can (in particular, even all averaged reference density functions can) belong to a pair of reference images, which can be viewed as and assumed as a sequence. The at least one reference density function can then (respectively) approximate a relative frequency of occurrence of pixel differences, which are formed between pixel values of the reference images of such a pair, wherein the pixel positions (positions in the image), for which such a difference is respectively formed, preferably coincide in both reference images of the respective pair.

In accordance with a favorable embodiment, the reference density functions respectively belong to a family, the members of which differ due to a respectively related scale parameter. In this way, for example, all can be a probability density for a normal, Cauchy or a Laplace distribution and comprise related scale parameters; in the case of a normal distribution, the scale parameter, for example, can be its standard deviation or variance. Thereby, the scale parameters can be determined in such a way that the respective probability density is optimal for a related image of the image library with regard to the incidence of pixel differences (in the respective family of the density functions, for example, the family of densities to Cauchy distributions).

In particular, the above-mentioned probability density function can be referred to at points (for each point of its definition range) as a weighted arithmetical means of the reference density functions (at the respective point), wherein the reference density functions—as has been mentioned—can belong to a family, in which they are identified by a respective scale parameter. The respective weight in the averaging then preferably describes a relative frequency of occurrence, by means of which the respective scale parameter occurs under the density functions belonging to the reference images. In this way, how frequently the respective differences occur in the images of the reference library flows into the probability density function and, thereby into the preliminary version of the quantizer to be determined. In the case of a suitably large reference library, thereby a high probability can be achieved that the quantizer determined in this way is particularly suited on average for use on any digital image occurring in reality.

A computer-readable medium according to the invention contains saved instructions in it, which carry out an inventive method in accordance with one of the embodiments disclosed in this publication if it they are executed by a computer. The computer-readable medium can, in particular, be a removable medium or a memory installed in an apparatus (for example, in a digital camera).

An apparatus according to the invention implements at least two quantizers as a digital circuit. The at least two quantizers thereby comprise a first quantizer with a first number of levels and a second quantizer with a second number of levels, wherein the second number of levels is greater than the first number of levels. At least one or all of the first quantizer values assumed by a first quantizer thereby occur as quantizer values of the second quantizer. Preferably, the first and/or the second quantizer comprise(s) a non-linear or non-equidistant graduation of the quantizer levels (so that levels with varying widths occur between at least two quantizer levels). The second quantizer is determined in accordance with a (the "first") method according to the invention in accordance with one of the embodiments disclosed in this publication.

In accordance with a preferred design variant, the apparatus even implements a multitude of quantizers with an increasing number of levels as a digital circuit. Under the quantizers of the multitude of quantizers, thereby, preferably, the value set of one of the two quantizers is contained in the value set of the other quantizer.

Such an apparatus makes a particularly favorable control possible when coding an image by being able to apply different quantizers one after another and being able to estimate the effects of a quantizer change respectively. In this way, for example, in the case of a transmission, at total of one target bandwidth and/or a desired image quality can be specifically upheld.

A digital camera according to the invention comprises an apparatus according to the invention, for example, in a computing unit, such as a processor, a digital signal processor or a FPGA (field programmable gate array) in particular. An image scene, which can be mapped by means of an objective onto an image sensor of the camera by means of an objective, can then be transferred to the apparatus or computing unit and further processed in it by being able to quantize the contained image data in the form of pixel differences. The quantized data can then be further processed, for example, converted (e.g., coded in bit sequences), stored and/or transmitted to another device.

BRIEF DESCRIPTION OF THE DRAWINGS

Preferred exemplary embodiments of the invention will be described in detail in the following based on the drawings. It is to be understood that individual elements and components can also be combined in a different manner than what is shown. Reference numbers for elements corresponding to each other are used across all figures and, if applicable, not newly described for each figure.

On a schematic level, the figures show.

DETAILED DESCRIPTION OF THE PREFERRED EMBODIMENTS

Figure 1A:
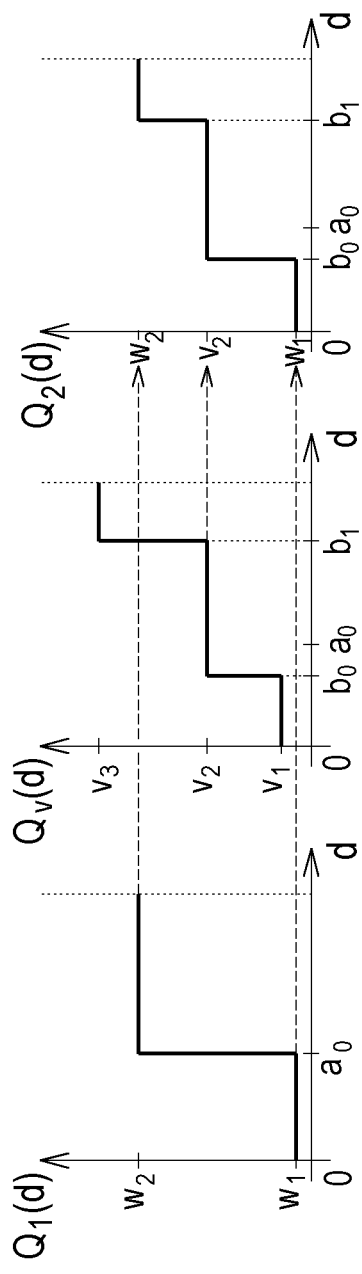
FIG. 1a: an approach for determining a quantizer in accordance with a first exemplary embodiment of the present invention.
Figure 1B:
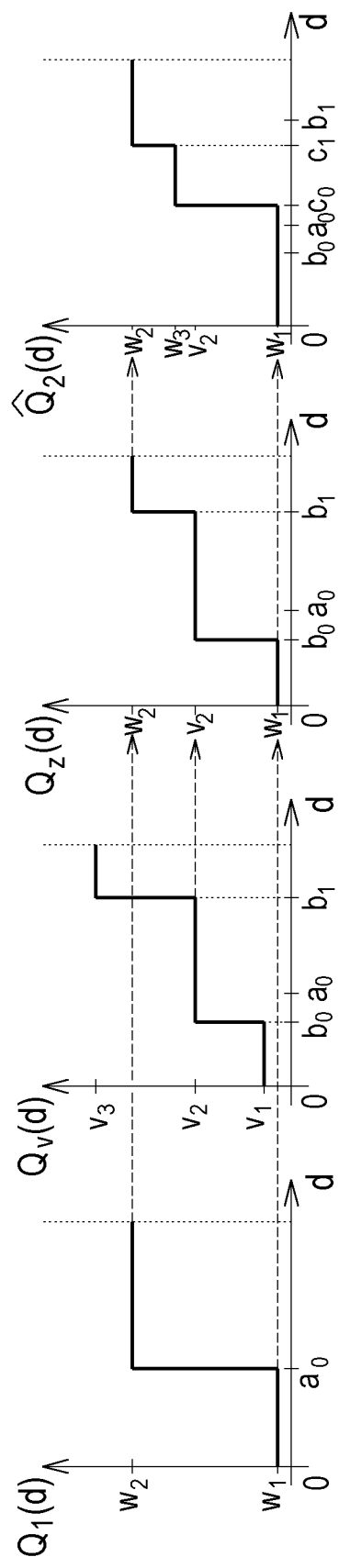
FIG. 1b: an approach for determining a quantizer in accordance with a second exemplary embodiment of the present invention FIGS. 2a, b: an exemplary reference density and a function resulting from this in the case of the modulo operation.

In FIGS. 1a and 1b, it is schematically illustrated how a quantizer Q2 can be determined according to the invention in accordance with a first exemplary embodiment of the present invention.

Thereby, FIG. 1a shows three assignment rules, which assign respective quantizer values to elements of a (common) definition range respectively. The definition range can, for example, be given by the set of possible (meaning achievable) pixel differences between adjacent pixels of an image or between pixels of the same position in two different images; in the case of a pixel space with possible pixel values $p \in \{0, \ldots, 255\}$, for example, the elements of the set $\{-255, \ldots, 255\}$ are possible as differences. By means of a modulo operation (in the present example, mod 256), the definition range can be limited to the non-negative range $\{0, \ldots, 255\}$, the elements of which are referred to here as "modified differential values." The modulo operation can also be implicitly executed by showing the differential value in a binary manner with a specified number bits.

In the example shown in FIG. 1a, a quantizer Q2 is determined with a specified number of levels 3. Thereby, in the present, initially, a preliminary version Qv of a quantizer is determined (e.g. by means of a Lloyd-Max method), the number of levels of which coincides with the specified number of levels 3.

As can be recognized in FIG. 1a, the preliminary version assigns one of the values v1, v2, v3 to the modified differential values d; thereby, it has level changes (points of discontinuity) in the points b0 and b1 (of the definition range).

In accordance with the illustrated exemplary embodiment, the quantizer Q2 from the preliminary version Qv is now determined taking the other quantizer Q1 with the smaller number of levels 2 under consideration (and point of discontinuity at point a0).

In addition, those values of the preliminary version Qv, which are closest to a respective quantizer value of the other quantizer Q1, are then replaced with these values of the other quantizer. As can be recognized in FIGS. 1a and 1b, in the example shown, the value v1 of the preliminary version lies the closest to the quantizer value w1 of the other quantizer Q1 from the three values, of the preliminary version and the value v3 of the preliminary version lies closest to the quantizer value w2 of the other quantizer Q1.

Now, the values v1 and v3 in the preliminary version Qv are replaced by the values w1 and w2, the value v2, which has a greater distance than v1 and v2, is, in contrast, maintained. Thereby, the quantizer Q2 results from this, the quantizer values w1 and w2 of which are balanced with the quantizer values of the other quantizer Q1.

In FIG. 1b, it is schematically shown how a quantizer $\hat{Q}2$ can be determined according to the invention in accordance with an alternative embodiment: The quantizer determined in accordance with the approach shown in FIG. 1a is considered an intermediate version Qz here.

From this, now, subject to maintaining the balanced quantizer values w1 and w2, the quantizer $\hat{Q}2$ to be determined is determined for the specified number of levels, for example, by applying the Lloyd-Max method. Thereby, in the example shown, level changes result at the points of discontinuity C0 and C1, wherein, in the present, b0<a0<c0<c1<b1. applies.

The preliminary version can (in both design variants) preferably be based on a probability density function. This can result from a (e.g., weighted arithmetical) averaging of other density functions, which preferably belong to at least one reference image respectively. Such reference density functions can, for example, respectively approximate a function, which assigns the relative frequency of occurrence to the conceivable differences of two pixel values, by means of which the differences occur in the related reference image respectively.

Figure 2A:
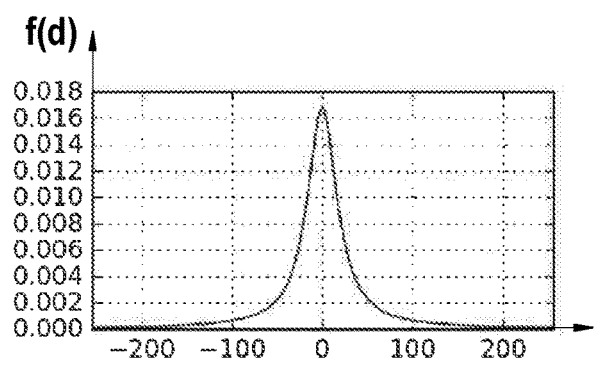

In FIG. 2a, such a reference density function f is shown. In the present example, it belongs to the family of Cauchy distributions, wherein has the scale parameter s=20. Thereby, in FIG. 2a, the set with the pixel values {0, . . . , 255} is assumed as a pixel space so that—as is mentioned above, the elements of the set {−255, . . . , 255} result as possible differential values.

Figure 2B:
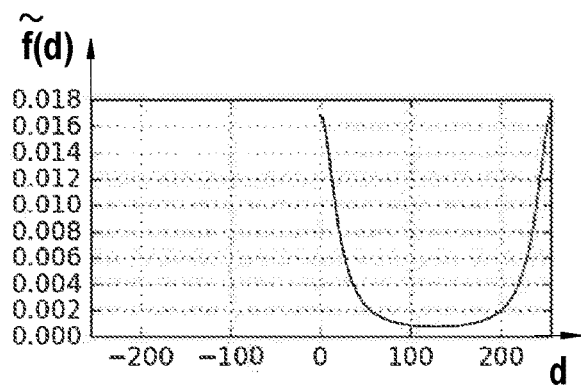

Using the graphs of the function f, FIG. 2b shows the effect of the modulo operator mod 256: {−255, . . . , 255}->{0, . . . , 255}. mod 256 (d):=d mod 256 on the incidences (of the modified differences).

Thereby, a quantizer with correspondingly reduced definition range {O, . . . , 255} can be determined and used, the points of which (in contrast to the original possible differences) can each be presented with only eight bits.

Figure 3:
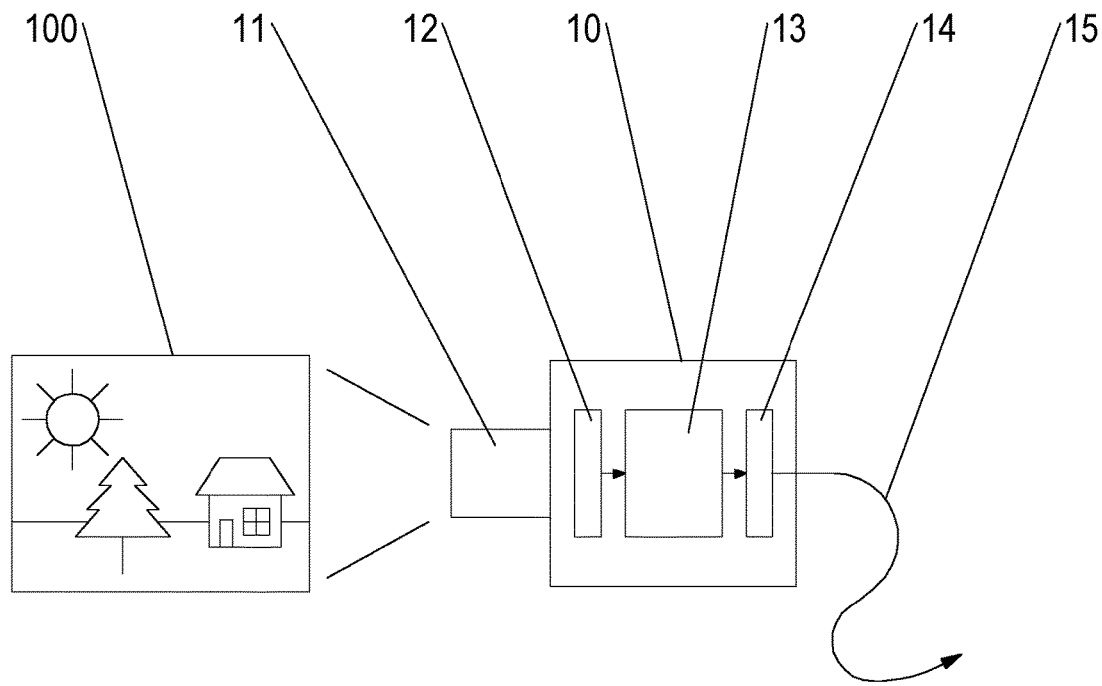
FIG. 3: a digital, according to the invention in accordance with an exemplary embodiment with an exemplary image scene.

FIG. 3 shows a schematic illustration of a construction of a digital camera 10 according to the invention with an objective 11 as an example. Thereby, an image scene 100 is mapped over the objective 11 onto an image sensor 12, which comprises a regular arrangement of light-sensitive elements; the image scene is mapped into pixel values by means of this.

The image sensor 12 transmits the pixel values as electrical data to a computing unit 13 within the camera 10, which includes, for example, a processor, a digital signal processor (DSP) or a FPGA. The computing unit 13 comprises an apparatus according to the invention, thereby implementing, in particular, at least to quantizers as a digital circuit, wherein the at least two quantizers comprise a first quantizer with a first number of levels and a second quantizer with a second greater number of levels and wherein at least one or all of the quantizer values assumed by the first quantizer occur as quantizer values of the second quantizer.

The electronic data are converted into a form that can be used by the user by means of at least one of the quantizers (wherein they can, for example, be coded) and then, the data are transmitted via an interface 14 as an electronic signal 15, for example, to a receiver (not shown).

A method for determining a quantizer Q2, ˆ; $Q_2$ for quantizing digital images, wherein the quantizer Q2, ˆ; $Q_2$ determined for a specified number of levels, which is at least two, is disclosed. For the determination, another quantizer Q1 with a lower number of levels than the specified one is taken into consideration.

Furthermore, a method for coding an image consisting of a plurality of pixels, a computer-readable medium, an apparatus, which implements at least two quantizers Q1, Q2, ˆ; $Q_2$ as a digital circuit and a digital camera 10 with such an apparatus is disclosed.

While at least one exemplary embodiment of the present invention(s) is disclosed herein, it should be understood that modifications, substitutions and alternatives may be apparent to one of ordinary skill in the art and can be made without departing from the scope of this disclosure. This disclosure is intended to cover any adaptations or variations of the exemplary embodiment(s). In addition, in this disclosure, the terms "comprise" or "comprising" do not exclude other elements or steps, the terms "a" or "one" do not exclude a plural number, and the term "or" means either or both. Furthermore, characteristics or steps which have been described may also be used in combination with other characteristics or steps and in any order unless the disclosure or context suggests otherwise. This disclosure hereby incorporates by reference the complete disclosure of any patent or application from which it claims benefit or priority.

REFERENCE LIST 10 digital camera
11 objective
12 image sensor
13 computing unit
14 interface
15 signal
100 image scene
d modified differential value
$Q_1$ other ("first") quantizer
$Q_1$, ˆ; $Q_2$ ("second") quantizer to be determined
$Q_v$ preliminary version
$Q_z$ intermediate version
$a_0$ point of discontinuity of the other ("first") quantizer $Q_1$
$b_0$, $b_1$ points of discontinuity of the preliminary version
$c_0$, $c_1$ points of discontinuity of the quantizer ˆ; $Q_2$ to be determined
$v_1$, $v_2$, $v_3$ (quantizer) values of the preliminary version
$w_1$, $w_2$, $w_3$ quantizer values of the other quantizer and of the quantizer to be determined

The invention claimed is:

1. A method for determining a second quantizer for compressing digital image data,
   wherein the second quantizer is determined for a specified number of levels, which is at least two, and
   wherein, for the determination of the second quantizer, a first quantizer with a lower number of levels than the second quantizer is taken into consideration,
   wherein the method comprises
      determining a preliminary version of the second quantizer with the specified number of levels, and
      replacing those values of the preliminary version, which are closest to quantizer values of the first quantizer, with the quantizer values of the first quantizer.

2. The method in accordance with claim 1, wherein the consideration entails assuming at least one or all of the quantizer values assumed by the first quantizer as quantizer values of the second quantizer to be determined.

3. The method according to claim 1, wherein the preliminary version of the second quantizer is based on a probability density function.

4. The method according to claim 3, which includes a determination of the probability density function by averaging reference density functions belonging to at least one reference image.

5. The method according to claim 4, wherein at least one of the reference density functions approximates a relative frequency of occurrence of pixel differences, which occur in the respective reference image as pixel value differences of adjacent pixels.

6. The method according to claim 4, wherein at least one of the reference density functions approximates a relative frequency of occurrence of pixel differences, which occur in at least two related reference images as pixel value differences at a respective pixel position.

7. The method according to claim 4, wherein the reference density functions respectively belong to a family, members of which differ due to a respectively related scale parameter.

8. The method according to claim 4, wherein the probability density function is calculated at points as a weighted, arithmetical or geometric means of the reference density functions.

9. The method according to claim 7,
   wherein the probability density function is calculated at points as a weighted, arithmetical or geometric means of the reference density functions, wherein a weight belonging to a reference density function with its related scale parameter describes a relative frequency of occurrence respectively, by means of which the respective scale parameter occurs under the density functions belonging to the reference images.

10. The method according to claim 1, further comprising the step of implementing the determined quantizer as an electronic circuit.

11. A computer-readable medium having stored theron instructions, causing a computer carrying out the instructions to perform a method for determining a second quantizer for compressing digital image data,
    wherein the second quantizer is determined for a specified number of levels, which is at least two, and
    wherein, for the determination of the second quantizer, a first quantizer with a lower number of levels than the second quantizer is taken into consideration,
    wherein the method comprises
       determining a preliminary version of the second quantizer with the specified number of levels, and
       replacing those values of the preliminary version, which are closest to quantizer values of the first quantizer, with the quantizer values of the first quantizer.

12. An apparatus, which implements at least two quantizers for compressing digital image data as a digital circuit,
    wherein the at least two quantizers comprise a first quantizer with a first number of levels and a second quantizer with a second number of levels,
    wherein the second number of levels is greater than the first number of levels,
    wherein at least one or all of the first quantizer values assumed by a first quantizer occur as quantizer values of the second quantizer.

13. Apparatus according to claim 12, wherein the apparatus is a digital camera comprising an apparatus according to claim 12.

* * * * *